United States Patent
Isenberg et al.

(10) Patent No.: US 6,531,663 B1
(45) Date of Patent: Mar. 11, 2003

(54) SOLDER STOP FOR AN ELECTRICAL CONNECTION AND METHOD THEREFOR

(75) Inventors: John Karl Isenberg, Rossville, IN (US); Carl William Berlin, West Lafayette, IN (US); Jay Robert Myers, Kokomo, IN (US); William Paul Ferraro, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 625 days.

(21) Appl. No.: 09/016,504

(22) Filed: Jan. 30, 1998

(51) Int. Cl.[7] .................................................. H05K 1/16
(52) U.S. Cl. ....................................... 174/260; 174/258
(58) Field of Search ................................. 174/250, 256, 174/258, 260

(56) References Cited

U.S. PATENT DOCUMENTS 4,017,889 A * 4/1977 Miller ........................ 257/778
4,929,284 A * 5/1990 Clanton ....................... 148/23
5,164,342 A * 11/1992 Muralidhar et al. .......... 501/20
5,637,261 A * 6/1997 Mattox ....................... 252/514

* cited by examiner

Primary Examiner—Albert W. Paladini
(74) Attorney, Agent, or Firm—Jimmy L. Funke

(57) ABSTRACT

An electrical connection for a surface-mount circuit device, and a method for forming the electrical connection. The electrical connection includes a solder stop that promotes the accurate location of a solder joint that electrically connects the surface-mount device to the conductor. In accordance with the invention, the solder stop also promotes stress relief of the electrical connection during thermal cycling, such that thermal cycle fatigue cracking occurs in the solder stop instead of the conductor and solder joint. As a result, thermal stresses are absorbed and dissipated by the solder stop, and do not adversely affect the continuity and mechanical integrity of the electrical connection. The solder stop preferably has a composition that contains an inorganic particulate filler in a glass matrix, the latter being present in an amount that forms a weak bond between the inorganic particles and between the solder stop and conductor.

9 Claims, 1 Drawing Sheet

US 6,531,663 B1

SOLDER STOP FOR AN ELECTRICAL CONNECTION AND METHOD THEREFOR

FIELD OF THE INVENTION

The present invention generally relates to electrical connections for surface-mount circuit components of hybrid circuits. More particularly, this invention relates to a thick-film solder stop for a solder joint of a surface-mount component, in which the solder stop has a composition that promotes the thermal cycle fatigue resistance of the electrical connection.

BACKGROUND OF THE INVENTION

Flip chips, ball grid arrays (BGAs), wire bond pads, chip resistors and chip capacitors are examples of surface-mount devices, i.e., discrete circuit devices mounted to the surface of a circuit board, such as a printed circuit board (PCB), ceramic substrate, printed wiring board (PWB), flexible circuit, or a silicon substrate. These devices rely on solder joints to both secure the chip to a circuit board and electrically interconnect the device to conductors formed on the circuit board. The size of a flip chip is generally on the order of a few millimeters per side, while bond pads, chip capacitors and resistors are typically smaller. As a result, the conductors required for surface-mount devices are narrow, e.g., line widths of about 0.5 millimeter or less, and typically spaced apart about 0.5 millimeter or less.

Because of the small size of the solder joints, soldering a surface-mount device to its conductor pattern requires a significant degree of precision. Reflow solder techniques are widely employed for this purpose, and typically entail precisely depositing a controlled quantity of solder using methods such as printing and electrodeposition. For smaller surface-mount devices, such as chip resistors and capacitors, the chip is soldered to its conductors by registering terminals formed on the chip with solder deposited on the conductors, and then reheating, or reflowing, the solder so as to form a "solder column" that metallurgically adheres and electrically interconnects the chip to the conductors, yielding a solder joint. Mounting of flip chips and BGAs differ in that the solder is typically deposited on bond pads on the chip. Thereafter, the chip is heated above the liquidus temperature of the solder to yield "solder bumps." After cooling to solidify the solder bumps, the chip is soldered to the conductor pattern by registering the solder bumps with their respective conductors and then reflowing the solder, again forming solder joints.

Placement of the chip and reflow of the solder must be precisely controlled not only to coincide with the spacing of the terminals and the size of the conductors, but also to control the orientation of smaller surface-mount devices and the height of flip chip solder joints after soldering. As is well known in the art, smaller chips are prone to twisting and tilting during reflow as a result of the device floating on the surface of the molten solder, while controlling the height of flip chip solder joints after reflow is often necessary to prevent the surface tension of the molten solder bumps from drawing the flip chip excessively close to the substrate during the reflow operation. Sufficient spacing between a flip chip and its substrate, which may be termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

The position and height of a solder column of a discrete component are generally controlled by limiting the surface area over which the printed solder is allowed to reflow. As illustrated in FIG. 1, which shows a conductor 12 in longitudinal cross-section, the latter approach typically involves the use of a solder stop 14, which is typically formed by a solder mask or printed dielectric. The solder stop 14 extends widthwise across the surface 18 of the conductor 12, which is printed or otherwise formed on a dielectric substrate 10, such as alumina. A solder joint 16 is shown as joining a surface-mount (SM) component 20 to the surface 18 of the conductor 12, as would be the case after solder has been printed and reflowed on the conductor 12, and the component 20 then registered and reflow soldered to the conductor 12. As is apparent from FIG. 1, the solder stop 14 delineates an area on the surface 18 of the conductor 12 over which solder is able to flow during reflow to form the solder joint 16. By properly locating the solder stop 14 on the conductor 12, the degree to which the molten solder can spread during reflow is controlled, which in turn determines the height of the solder joint 16 and therefore the stand-off height of the component 20 relative to the substrate 10.

Because solder is registered and soldered directly to the conductor 12, the conductor 12 must be formed of a solderable material, which as used herein means that a tin, lead or indium-based alloy is able to adhere to the conductor 12 through the formation of a metallurgical bond. In contrast, the solder stop 14 is intentionally formed of a nonsolderable material, meaning that solder will not adhere to the material for failure to form a metallurgical bond. Upon reflow, the reflow area defined by the solder stop 14 on the conductor 12 causes the solder joint 16 to have a columnar shape between the component 20 and the conductor 12.

Though widely used in the art, trends in the industry have complicated the ability for solder stops to yield solder joints that exhibit adequate reliability. Particularly, the trend is toward the use of low-melting, high-tin (e.g., 60Sn—40Pb) solder that is relatively brittle. Thermal cycle reliability problems can occur when a brittle solder solidifies against a solder stop used to contain the solder during reflow. During thermal cycling, fatigue fractures 22 tend to occur in the conductor 12 at the junction between the solder joint 16 and solder stop 14, as shown in FIG. 1. The cause of the fracture 22 is generally the mismatch of the coefficients of thermal expansion (CTE) of the conductor 12, solder stop 14 and solder. Solder stops are typically a hard thick-film dielectric material having a CTE roughly equal to that of the alumina substrate (about $6.7 \times 10^{-6}/°$ C.), while the CTE of the solder is typically much higher—e.g., about $25 \times 10^{-6}/°$ C. for lead-tin solders. The CTE mismatch is further exasperated by surface-mount components whose CTEs are typically about $4 \times 10^{-6}/°$ C. to about $25 \times 10^{-6}/°$ C. The resulting stresses developed in the joint during thermal cycling due to the large CTE mismatch are thought to be intensified or concentrated at the solder-conductor-solder stop interface, where the solder is inhibited by the hard solder stop material. Eventual stress relief is achieved through the creation of a crack through the underlying conductor, as shown in FIG. 1. The fracture occurs in the conductor because the conductor is the weakest structure at the solder-conductor-solder stop interface, and is therefore more susceptible to fracture by thermal cycle fatigue than the solder joint and solder stop.

To reduce the occurrence of fatigue fractures in conductors, solder stops formed of nonconductive polymer materials have been used that absorb the stresses created by the highly expanding solder. However, suitable polymers exhibit inferior printing characteristics and require special curing processes that are not conducive to thick-film manufacturing processes. Accordingly, it would be desirable if an improved solder stop were available that was capable of diverting or absorbing thermal stresses generated by the CTE mismatch at the conductor-solder stop interface.

SUMMARY OF THE INVENTION

It is an object of this invention to provide an electrical connection comprising a conductor, a solder joint, and a solder stop that inhibits fracturing of the conductor and solder joint during thermal cycling.

It is another object of this invention that the solder stop has a composition that renders it more susceptible to fracturing by thermal cycle fatigue than the conductor and solder joint.

It is yet another object of this invention that the solder stop sacrificially fractures during thermal cycling to relieve thermal stresses in the electrical connection, and therefore promotes the reliability and durability of the electrical connection when a surface-mount circuit device is bonded to the conductor with the solder joint.

The present invention provides an electrical connection for a surface-mount circuit device, and a method for forming the electrical connection. The electrical connection includes a solder stop that promotes the accurate location of a solder joint that electrically connects the surface-mount device to the conductor. In accordance with this invention, the solder stop also promotes stress relief of the electrical connection during thermal cycling, such that thermal cycle fatigue cracking occurs in the solder stop instead of the conductor and solder joint. As a result, thermal stresses are absorbed and dissipated by the solder stop, and do not adversely affect the continuity and mechanical integrity of the electrical connection.

According to this invention, the above benefits are achieved by the solder stop having a composition that renders it more susceptible to fracture by thermal cycle fatigue than the conductor and solder joint. To achieve this characteristic, the solder stop contains an inorganic particulate filler in a glass matrix, the latter being present in an amount that forms a weak bond between the inorganic particles and between the solder stop and conductor. The inorganic filler can be one or more of the following oxides: zirconia, alumina, silica, barium oxide, calcium oxide, magnesia and lanthana. The glass matrix can be formed by one or more of the following oxides: calcium oxide, alumina, lead oxide, boric oxide and silica. The inorganic filler preferably constitutes at least 75 weight percent of the solder stop, with the balance being the glass matrix and possible additional adjuncts, including inorganic colorants. The solder stop is preferably a thick-film dielectric formed by firing a thick-film ink that contains, by weight, about 20% to about 40% of an organic vehicle, up to about 5% of an inorganic colorant, with the balance being a mixture of the inorganic particulate filler and glass frit.

A solder stop having the above-described composition is generally porous, and therefore has multiple crack initiation sites. In addition, because the solder stop contains only enough glass matrix material to form a weak bond between the inorganic particles and between the solder stop and conductor, stresses induced in the electrical connection will eventually produce multiple cracks in the solder stop adjacent the solder joint instead of cracks in the conductor or solder joint. In effect, the solder stop is a sacrificial nonconducting member of the electrical connection, in which thermal stresses are concentrated and fatigue cracks are encouraged to develop in order to relieve thermal stresses in the electrical connection. Consequently, continuity and mechanical integrity of the conductor and solder joint, and therefore the electrical connection, are maintained.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 2:
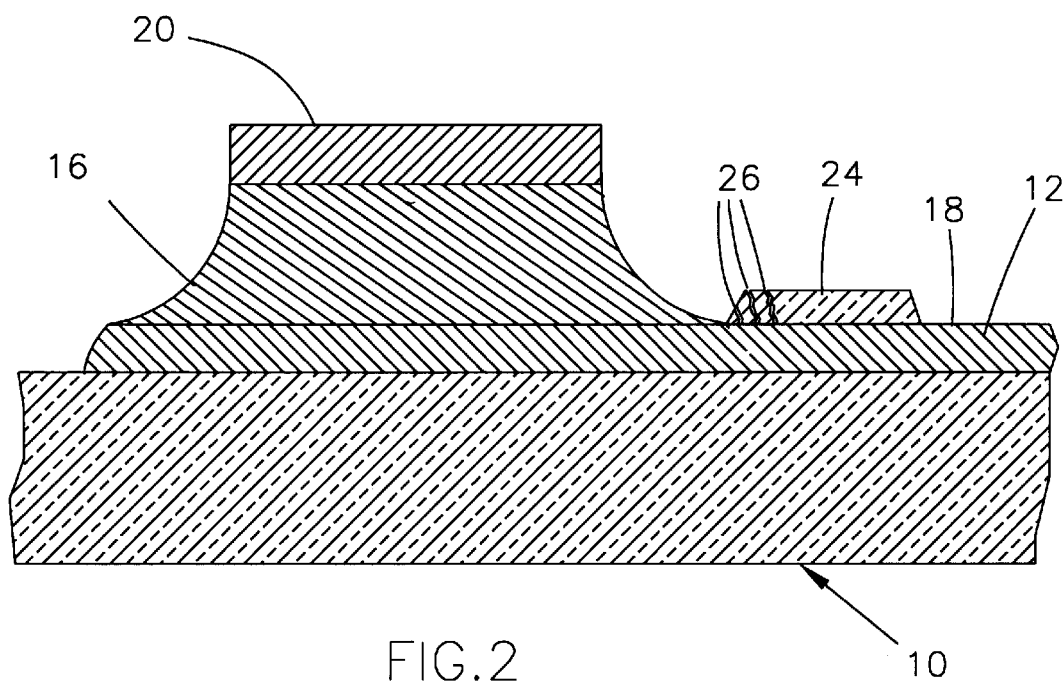
FIG. 2 is a cross-sectional view of a solder joint of a surface-mount device registered with a conductor employing a solder stop in accordance with the present invention.

With reference to FIG. 2, there is shown an electrical connection for a surface-mount device 10 in accordance with this invention. As shown, the electrical connection includes a solder joint 16 as it generally appears following deposition of solder on a conductor 12, registration of the device 20 with the solder, and a solder reflow operation that metallurgically bonds the solder to the conductor 12 and device 20, yielding the columnar shape for the joint 16 depicted in FIG. 2. Though a particular connection configuration is shown in FIG. 2, this invention is applicable to essentially any surface-mount component, including wire bond pads, chip capacitors, chip resistors, flip chips and BGAs. Accordingly, benefits arising from this invention can be realized for essentially any application in which solder must be reflowed on a conductor.

The conductor 12 shown in FIG. 2 has been printed or otherwise formed on a substrate 10, which may be a ceramic (e.g., alumina) substrate, printed wiring board, flexible circuit or silicon substrate, as is known in the art. As shown, a nonsolderable and nonconducting solder stop 24 overlies the conductor 12 and serves to limit the flow of the solder on the surface 18 of the conductor 12 during attachment of the device 20. As is conventional for electronic applications, the solder composition that forms the solder joint 16 may be a tin or lead-base solder alloy that can be reflowed at sufficiently low temperatures to avoid thermal damage to the circuitry. As is also conventional, the conductor 12 can be formed of known thick-film ink compositions, notable examples of which include QS179 and 7484, produced and commercially available from E.I. DuPont de Nemours and Company, Inc., of Wilmington, Del. The QS179 composition is based on silver-platinum alloys, while the 7484 composition is based on silver-palladium alloys.

Figure 1:
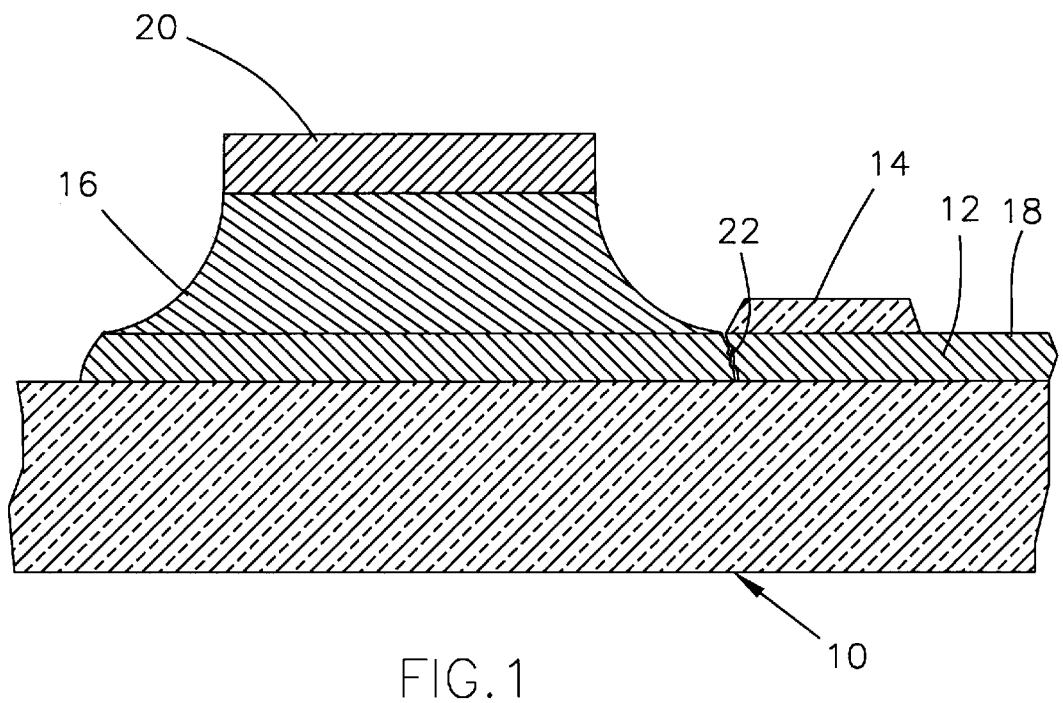
FIG. 1 is a cross-sectional view of a solder joint of a surface-mount device registered with a conductor employing a solder stop in accordance with the prior art.

According to this invention, the solder stop 24 differs from the prior art solder stop 14 depicted in FIG. 1, by having a composition that reduces the strength of the solder stop 24 and provides multiple crack initiation sites. In addition, the solder stop composition is formulated to yield a relatively weak bond with the conductor 12. As a result, thermal stresses generated during thermal cycling of the electrical connection are diverted and absorbed in the solder stop 14, producing thermal fatigue fractures 26 that absorb and dissipate the thermal stresses. By absorbing and dissipating thermal stresses in the solder stop 24, the continuity and mechanical integrity of the conductor 12 and solder joint 16 remain intact, thereby promoting the life of the electrical connection.

Solder stops in accordance with this invention are preferably formed from a thick-film dielectric ink containing an inorganic particulate filler in a relatively weak glass matrix. Suitable materials for the inorganic filler include zirconia ($ZrO_2$), alumina ($Al_2O_3$), silica ($SiO_2$), barium oxide (BaO), calcium oxide (CaO), magnesia (MgO) and lanthana ($La_2O_3$). These materials can be used alone or in any combination, with a preferred filler being alumina. A preferred particle size for the filler is about one to three micrometers. A suitable alumina powder for use as the inorganic filler is commercially available from Alcoa Corporation under the name A-1000SGD.

Suitable materials for the glass matrix are glass frits including calcium oxide, alumina, lead oxide (PbO), boric oxide ($B_2O_3$) and silica, which can be used alone or in any combination. A preferred particle size for the glass frit particles is about one to ten micrometers, with a surface area of about 2.4 to 3.0 $m/g^2$. A suitable glass frit composition is commercially available from the Ferro Corporation under the name EG-2778.

In accordance with this invention, the inorganic filler preferably constitutes at least 75 weight percent of the solder stop 24, with the balance being the glass matrix and possible additional adjuncts, including inorganic colorants. A preferred composition is about 95 to about 98 weight percent inorganic filler, the balance glass matrix. Within the stated ranges, the glass matrix provides only a weak bond between the particles of the inorganic filler, and also yields the desired weak bond between the solder stop 24 and the conductor 12. Due to the high volume of particulate filler, the solder stop 24 is also generally porous, and therefore has multiple crack initiation sites. As a result, thermal stresses induced in the electrical connection will concentrate in the solder stop 24, and eventually produce multiple cracks in the solder stop 24 at the solder joint-conductor-solder stop interface, instead of producing cracks in the conductor 12 or solder joint 16. In effect, the solder stop 24 is a sacrificial nonconducting member of the electrical connection, in which fatigue cracks are encouraged to develop in order to relieve thermal stresses in the electrical connection.

The solder stop 24 can be formed in a conventional manner from a thick-film dielectric ink that is printed and fired on the conductor 12. A suitable thick-film ink contains, by weight, about 20% to about 40% of an organic vehicle, up to about 5% of an inorganic colorant, with the balance being a mixture of the inorganic particulate filler and glass frit in the above-stated ranges. Suitable organic vehicles are well known in the art. A particularly suitable organic vehicle can be prepared from the following constituents: about 45.6 weight percent of a thinner commercially available from DuPont under the name 9506, about 45.6 weight percent of a second thinner commercially available from DuPont under the name 8250, about 5.0 weight percent of a surfactant commercially available from Ashland Chemical Company of Columbus, Ohio, under the name Igepal CO-430, and about 3.8 weight percent ethyl cellulose, which is widely available from such sources as the Aqualon Company of Wilmington, Del. To this composition, a colorant may be added in an amount ranging from about one to two weight percent, a suitable example of which is an organic colorant commercially available from the Hommel Corporation under the name BG-210D.

The constituents of the thick-film dielectric ink composition of this invention are preferably mixed together using a three-roll mill. The milled ink can then be readily screen printed onto a hybrid circuit, dried to a conventional thickness, e.g., about fifteen to forty micrometers, and then fired using a conventional thick-film firing profile, e.g., a peak temperature of about 850° C.

During investigations leading to this invention, electrical connections having the general appearance of FIGS. 1 and 2 were prepared and thermal cycled between −50° C. and 150° C. A first group of the connections was formed with conventional glass dielectric solder stops formed from a thick-film ink commercially available from DuPont under the name 5707, while a second group was formed with the solder stops of this invention having the following composition, by weight:

| | |
|---|---|
| Glass frit | 3.7% |
| Alumina filler | 69.7% |
| Organic colorant | 1.5% |
| Organic vehicle | 25.1% |

The inks were printed and fired directly on thick-film conductors formed of DuPont 7484, on which a 60Pb—40Sn solder was subsequently printed. Components were then registered with the solder, which was then reflowed to form a solder joint between the component and conductor.

Thermal cycle reliability of the electrical connections was then evaluated by monitoring the electrical resistance of the connections during the thermal cycle test. Changes in resistance for specimens having the solder stops of this invention varied only slightly after 1250 cycles. In contrast, those specimens with the prior art solder stops exhibited a drastic increase in resistance after about 250 cycles, with a final resistance after 1250 cycles being almost six times greater than the resistance measured prior to testing. Optical microscopy of the solder-conductor-solder stop interfaces revealed cracks penetrating through the conductors (similar to that depicted in FIG. 1) of those specimens with the prior art solder stops, while cracking was limited to the solder stops (similar to that depicted in FIG. 2) of those specimens having the solder stop composition of this invention. From these results, it was evident that the solder stops of this invention sacrificially cracked during thermal cycling, such that the continuity and mechanical integrity of the conductors and solder joints were maintained.

While the invention has been described in terms of a preferred embodiment, it is apparent that other forms could be adopted by one skilled in the art. For example, various materials could be foreseeably used to yield a solder stop that will sacrificially fatigue fracture during thermal cycling. Accordingly, the scope of the invention is to be limited only by the following claims.

What is claimed is:

1. An electrical connection including a conductor, a solder joint on the conductor and a solder stop on the conductor, the improvement wherein:

the solder stop comprises inorganic particles in a glass matrix the inorganic particles comprising at least 75 weight percent of the solder stop, thereby resulting in a weak bond between the inorganic particles that is more susceptible to cracking by thermal cycle fatigue than the conductor and solder joint.

2. An electrical connection as recited in claim 1, wherein the inorganic particles comprise at least one oxide chosen from the group consisting of zirconia, alumina, silica, barium oxide, calcium oxide, magnesia and lanthana.

3. An electrical connection as recited in claim 1, wherein the inorganic particles comprise about 95 to about 98 weight percent of the solder stop.

4. An electrical connection as recited in claim 1, wherein the solder stop is porous thereby providing multiple crack initiation sites.

5. An electrical connection comprising:

a conductor;

a solder joint on the conductor; and a solder stop on the conductor, the solder stop comprising at 75 weight percent of an inorganic particulate filler in a glass matrix, the inorganic particulate filler being at least one oxide chosen from the group consisting of zirconia, alumina, silica, barium oxide, calcium oxide, magnesia and lanthana, the glass matrix being formed of at least one oxide chosen from the group consisting of calcium oxide, alumina, lead oxide, boric oxide and silica, the solder stop being more susceptible to fracture by thermal cycle fatigue than the conductor and solder joint.

6. A method for forming an electrical connection including the steps of forming a conductor, forming a thick-film solder stop on the conductor and forming a solder joint on the conductor, the improvement wherein:

the solder stop comprises inorganic particles in a glass matrix, the inorganic particles comprising at least 75 weight percent of the solder stop, thereby resulting in a weak bond between the inorganic particles that is more susceptible to cracking by thermal cycle fatigue than the conductor and solder joint.

7. A method as recited in claim 6, wherein the inorganic particles comprise at least one oxide chosen from the group consisting of zirconia, alumina, silica, barium oxide, calcium oxide, magnesia and lanthana.

8. A method as recited in claim 6, wherein the inorganic particles comprise about 95 to about 98 weight percent of the solder stop.

9. A method as recited in claim 6, wherein the step of forming the solder stop entails depositing and then firing a thick-film ink on the conductor, the thick-film ink comprising, by weight, about 20% to about 40% organic vehicle, up to about 5% of an inorganic colorant, and a mixture comprising, by weight, at least 75% inorganic particles and up to about 25% glass frit.

* * * * *